United States Patent [19]

Kelly

[11] 4,443,758
[45] Apr. 17, 1984

[54] METER TO PRINTER COUPLING CIRCUIT

[75] Inventor: Charles A. P. Kelly, Barrington, N.J.

[73] Assignee: Northern Telecom Inc., Nashville, Tenn.

[21] Appl. No.: 253,069

[22] Filed: Apr. 10, 1981

[51] Int. Cl.³ .......................................... G01R 13/04
[52] U.S. Cl. .................................... 324/113; 324/157
[58] Field of Search ...................... 324/113, 126, 157; 307/247 A; 400/77

[56] References Cited

U.S. PATENT DOCUMENTS 3,710,913  1/1973  Brennan, Jr. et al. ................ 400/77

Primary Examiner—Ernest F. Karlsen
Attorney, Agent, or Firm—Schwartz, Jeffery, Schwaab, Mack, Blumenthal & Koch

[57] ABSTRACT

A coupling circuit for coupling a printer to a meter permits single line digital printout of metered data in response to operation of a manual switch. Printing is initiated when a bistable occupies one state and a print command is produced by the meter indicating that a stable voltage has been detected by the meter. That bistable state is produced by manual operation of a switch, such operation also triggering a hold unit within the meter to hold the stable reading for a period permitting data to be shifted to the printer and for printing to occur. While printing and paper advance is under way, the printer delivers a busy signal to the bistable to change its state. Subsequent state reversal can then only take place on manually operating the switch once again. In this way only a single line of print is achieved on command. The particular logic arrangement described prevents erroneous printing of lines of data in response to switch contact bounce.

6 Claims, 1 Drawing Figure

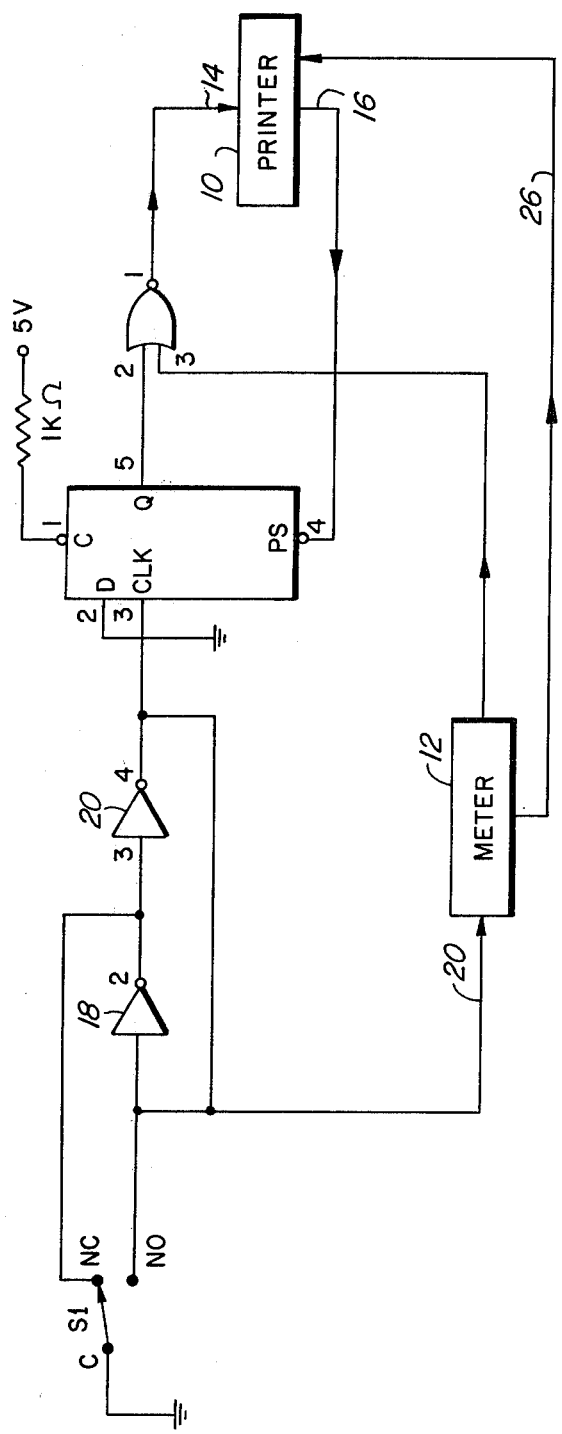

METER TO PRINTER COUPLING CIRCUIT

This invention relates to a coupling circuit for coupling a meter to a printer for providing a hard copy of a reading displayed by the meter.

A frequent requirement for test equipment such as high quality voltage and current supply testers is that they should provide both a real time visual indication and a hard copy record of monitored supply data. A simple way of providing these two functions is to incorporate into such testers a proprietary meter and printer. Combinations of such units are known in which coupling between meter and printer provides for periodic production of printed data lines in response to the periodic sampling of meter input voltages, the sampling, the shifting of data from meter to printer, and initiation of a print command to the printer being regulated by a common timing function.

In a typical universal supply tester, voltage and current for a wide range of loads are methodically tested. For the purposes of such a tester, the printer is not required to log the meter reading in a strictly periodic manner but, ideally, should print a single line on command if the particular reading is considered significant by the person performing the tests. A coupling circuit is now proposed which permits operation of a meter/printer combination to print a single line on command. An added advantage of the coupling circuit is that the logic arrangement used inhibits erroneous printing of redundant lines of data which might occur through operation of a switch having high contact bounce.

According to the invention there is provided a circuit for coupling a meter to a printer, the meter being responsive to a first signal to adopt a stable state and to produce a second signal in said state, and said printer being responsive to a print command to start printing and to produce a busy signal while it is printing, the circuit comprising a bistable device which is responsive to the busy signal to adopt a first state; switching means operable to produce said first signal and to trigger the bistable device to adopt a second state in the absence of the busy signal; and gating means responsive to the bistable device having the second state to produce the print command in the presence of said second signal.

Preferably the bistable device is a D-type flip-flop having the switch means coupled to a clock terminal thereof and having a preset terminal for application of said busy signal thereto. The switching means preferably includes a manually operable switch which, in a first normal, position, directs a third signal to the meter to maintain the meter in a free-running state and which, during a switch cycle produces said first signal to hold a reading at the meter. The gate means can be a NOR gate.

An embodiment of the invention will now be described by way of example with reference to the accompanying drawing which is a circuit schematic representation of a meter/printer coupling circuit.

Referring in detail to the drawing, the coupling circuit couples a miniature digital panel printer 10 available from Datel System Inc., Caton, Mass., under the specification number DDP-7, to a digital panel meter 12 obtainable from Weston Instruments, Newark, N.J., under the specification number 2470. Details of the printer 10 and digital meter 12 are relevant only to the extent to which they interact with the coupling circuit. In this respect, the meter 12 incorporates a sampling unit which samples at a preset rate input voltages signifying the metered current or voltage. When the unit detects a stable condition it emits a print command pulse. The sampling rate is slow, being of the order of 1-2 seconds. At this low rate, the person preforming the test is not faced with a confusing sequence of blinking meter digits. At the same time there is ample time between consecutive sampling operations to permit the printing of a line of data. The meter is normally in a free-running state but incorporates a hold unit which allows a particular reading to be held for a period sufficient for printing a line of data.

The printer is characterized by a print and paper advance unit which is set to print a line of data in response to a print command pulse appearing at input terminal 14. The printer 10 has an output terminal 16 which indicates whether or not the print and paper advance unit is busy.

The coupling circuit will now be described in terms of operation. Printing is initiated by actuating a pushbutton switch S1. When moved to the normally open position, NO, a low to high transition passes via tandem buffer inverters 18, 20 to the clock terminal, CLK of a D-type flip-flop.

Actuation of switch S1 also passes a logic 0 to meter terminal 21 to trigger its hold unit to hold the displayed reading for as long as S1-NO connection is made and during the time that switch S1 moves back to NC after switch release. This time interval is sufficiently long for printing of a line of data. In response to the low to high transition at CLK, the flip-flop produces a logic 0 at output terminal Q if the input to a preset terminal PS of the flip-flop is high (logic 1). The clear terminal C is maintained permanently at logic 1 from a 5 V supply so effectively disabling the clear input. If a print and advance cycle is not under way, the input from the printer 10 to terminal PS is high (logic 1). With these conditions, a logic 0 output is transferred from the flip-flop D terminal to the Q terminal and is directed to a NOR gate. The NOR gate delivers a print command logic 1 to the printer 10 if a logic 0 is present also at its other input terminal. This latter input is logic 0 if the meter sampling unit has detected a stable condition.

Once a print and paper advance cycle is initiated, a logic 0 is applied to preset terminal PS of the flip-flop whereupon the output Q is rendered logic 1 and the NOR gate disabled. The print and advance unit discontinues operation at the completion of a line of print until it receives a subsequent print command pulse. Such a pulse is generated only by the switch S1 being cycled so limiting print operation to a line at a time even though the meter 12 is operating in a free-running mode. When no print and advance operation is taking place, free-running of the meter is assured by returning the switch to its normally closed position, NC whereupon logic 0, inverted at buffer inverter 20, is applied at terminal 21 of the meter. The action of buffer inverters 18, 20 ensures that only one low to high transition occurs at flip-flop terminal CLK for each cycle of switch S1 thus ensuring a single line of print. Once the switch S1 is restored to the NC position, any further pulse is blocked by path 19 to ground.

A data bus between the meter 12 and the printer 10 is indicated schematically at 26. In the particular meter/printer combination of this embodiment of the invention, the meter contains a binary coded decimal (BCD) unit which presents stable data coincidentally with a logic 0 print command from the meter to the NOR gate indicating that analog to digital conversion is complete.

Although not shown in detail the BCD output offers four binary coded decimal words and a polarity indicator. This is used to indicate voltages and current to within 0.01 V and 0.1 A respectively.

Although the invention has been described in terms of a specific example of digital meter and printer, it will be recognized that different meter/printer combinations can benefit from use of the coupling circuit described. Such combinations should however have the functions described previously to enable interaction with the coupling circuit. However as will be recognized in the art, logic convention and the particular logic devices can be altered so long as they are functionally equivalent to those of the arrangement described.

What is claimed is:

1. An electronic device, comprising:
    a printer having a data input to receive data to be printed, a print input for receiving a print command signal to initiate printing of received data, and a status output for providing a busy signal when said printer is printing;
    a meter for sensing a variable to be measured and providing a signal indicative of a value of said variable, said meter having a data output connected to said data input for supplying said data signal to said printer, said meter also having a hold input for receiving a hold signal to cause said meter to enter a stable state holding a sensed value of said variable, and a stable state output for providing a stable state signal in response to said stable state;
    switch means for providing a control signal, said meter hold input being connected to said switch means for receiving said control signal as said hold signal;
    bistable circuit means having an output and having inputs connected to said printer status output and said switch means for providing a first state output signal in response to said busy signal and providing a second state output signal in response to said control signal when said busy signal is not present; and
    gating means having inputs connected to said bistable circuit means output and said meter print command output and having an output connected to said printer circuit input for providing said print command signal to said printer in response to said second state signal and said stable state signal.

2. An electronic device as claimed in claim 1, wherein said bistable circuit means comprises a D-type flip-flop wherein said bistable circuit means input connected to said switch means comprises a clock terminal.

3. An electronic device as claimed in claim 2, wherein said bistable circuit means input connected to said printer status output comprises a preset terminal.

4. An electronic device as claimed in claim 1, wherein said meter has a free running mode in which said data signal is continuously updated, and wherein said switch means includes a first position for providing said control signal and a second position for providing a free running signal to cause said meter to assume said free running state.

5. An electronic device as claimed in claim 1, wherein said gating means is a NOR gate.

6. An electronic device as claimed in claim 1, wherein said switch means comprises a manually actuatable single pole double throw switch, a first inverter, and a second inverter, said single pole double throw switch having a normally open contact connected to an input of said first inverter, said first inverter having an output connected to an input of said second inverter, and said second inverter having an output connected to said input of said first inverter and to said bistable circuit means, said single pole double throw switch having a normally closed contact connected to said input of said second inverter, wherein said input of said first inverter is connected to said meter hold input.

* * * * *